United States Patent
Polce

[11] Patent Number: 6,037,602
[45] Date of Patent: Mar. 14, 2000

[54] PHOTOVOLTAIC GENERATOR CIRCUIT AND METHOD OF MAKING SAME

[75] Inventor: Nestore Polce, Chelmsford, Mass.

[73] Assignee: C.P. Clare Corporation, Beverly, Mass.

[21] Appl. No.: 09/023,899

[22] Filed: Feb. 13, 1998

[51] Int. Cl.[7] ........................... G02B 29/00; H01L 31/00; H01L 21/302

[52] U.S. Cl. ............................. 250/551; 257/444; 438/73

[58] Field of Search ................................ 250/551, 214 R; 257/443, 444, 431, 82, 84; 438/59, 69, 73, 94; 327/427, 514

[56] References Cited

U.S. PATENT DOCUMENTS

| | | | |
|---|---|---|---|
| 4,268,843 | 5/1981 | Brown et al. | 357/19 |
| 4,777,387 | 10/1988 | Collins | 307/270 |
| 4,804,866 | 2/1989 | Akiyama | 307/311 |
| 4,873,202 | 10/1989 | Akiyama | 437/62 |
| 4,916,323 | 4/1990 | Hayashi et al. | 250/551 |
| 4,996,163 | 2/1991 | Sasaki | 437/5 |
| 5,001,080 | 3/1991 | Wada et al. | 437/51 |
| 5,105,090 | 4/1992 | Miyajima et al. | 250/551 |
| 5,151,602 | 9/1992 | Idaka et al. | 250/551 |
| 5,223,446 | 6/1993 | Miyajima et al. | 437/40 |
| 5,278,422 | 1/1994 | Kato et al. | 250/551 |
| 5,549,762 | 8/1996 | Cantarini | 136/249 |
| 5,610,094 | 3/1997 | Ozaki et al. | 437/62 |

*Primary Examiner*—Edward P. Westin
*Assistant Examiner*—Kevin Pyo
*Attorney, Agent, or Firm*—McDermott, Will & Emery

[57] ABSTRACT

A solid state photovoltaic generator circuit includes a source of activating radiation, an array of photodiodes responsive to the radiation, a switching device coupled to the photodiode array for responding to an electrical signal therefrom, and a high-impedance resistor which is made of substantially single-crystal silicon and is formed during the formation of the switching device. The fabrication of the circuit is thus significantly simplified and the resistor performance is stable over a wide range of operating temperatures.

51 Claims, 6 Drawing Sheets

PHOTOVOLTAIC GENERATOR CIRCUIT AND METHOD OF MAKING SAME

TECHNICAL FIELD

The present invention relates to photovoltaic generator circuits, and more particularly to improvements in the design of such circuits to simplify their fabrication and thus reduce their unit cost, without sacrificing reliability or performance quality.

BACKGROUND OF THE INVENTION

Photovoltaic generator circuits can be used to control the operation of switching devices, such as, for example, relays and transistors. A solid state integrated photovoltaic generator circuit is disclosed in, for example, U.S. Pat. No. 5,549,762 to Cantarini. The circuit typically includes an array of photodiodes connected in series with one another, and a switching device, such as, for example, a transistor, connected in parallel with the photodiode array.

A typical fabrication process for photovoltaic generator circuits involves numerous mask and etch steps which define within the silicon substrate distinct p-type (+) and n-type (−) regions which are necessary for semiconductor operation. For example, a single crystal silicon wafer of either the n- or p-type is first oxidized and then overlaid with a layer of poly-crystal silicon. The poly-crystal silicon layer is then doped with a complementary dopant to define a resistive element within the circuit. The doped poly-crystal silicon layer is then selectively masked and etched, and an insulating silicon dioxide layer is formed over the exposed portions. A second mask step selectively masks regions of the substrate for selective removal of the oxide layer. A p- or n-type dopant is then diffused into the exposed layers to form a portion of a switching element, such as a field-effect transistor (FET). Another mask and etch step, followed by a dopant step, completes the fabrication of the switching element. Further mask and etch steps are required to define the electrical connections for the circuit components and to passivate the circuit.

The use of poly-crystal silicon resistive elements within a photovoltaic generator circuit is problematic. In particular, resistors formed of poly-crystal silicon must be lightly doped with a dopant of an opposite conductivity type to that of the silicon. At the low dopant level required to provide sufficiently high impedance, the crystal lattice of poly-crystal silicon is unstable, and thus its performance over the expected operating temperature range of the device is also unstable. Also, as outlined above, the fabrication of an integrated circuit in which a lightly-doped, high-impedance poly-crystal silicon resistor is used is relatively complex and is thus relatively labor-intensive and costly.

It would therefore be advantageous to provide a photovoltaic generator circuit which can be fabricated in fewer process steps than those of the prior art and which overcomes the disadvantages of the prior art photovoltaic generator circuits.

SUMMARY OF THE INVENTION

According to one aspect of the invention, there is provided a photovoltaic generator circuit, comprising:

a. a source of activating radiation;

b. an array of photovoltaic photodiodes, coupled optically to the source of activating radiation, for generating an electrical signal in response to activating radiation received from the source;

c. a switching device electrically coupled to the photodiode array and operable in response to the electrical signal; and d. a high-impedance resistor electrically connected to the switching device.

The photovoltaic photodiodes, the switching device and the resistor together comprise a solid state integrated circuit. At least the high-impedance resistor is made of substantially single-crystal silicon.

In a preferred embodiment, the switching device can be a transistor, such as, for example, a FET which is characterized by a normally ON condition. The FET includes source, drain and gate terminals and a channel electrically linking the source and drain terminals. In a preferred embodiment, the resistor is formed in the same process step in which the channel is formed. The FET can be, for example, a metal oxide semiconductor field effect transistor (MOSFET).

The high-impedance resistor is formed from silicon of a preselected conductivity type (n-type or p-type) and is lightly doped with a sufficient amount of a dopant of an opposite conductivity type to impart to the resistor an impedance of at least 1 megohm, and preferably in the range of approximately 1 to 20 megohms. With the high-impedance resistor, the circuit is substantially thermally stable in an operating temperature range of at least approximately 20° to 130° C.

The circuit can further include means for preventing activating radiation from impinging on the resistor. This can comprise, for example, a coating which is opaque to the activating radiation and which is deposited over at least a substantial portion of the resistor. The radiation-opaque coating may be a substantially radiation-reflective material so that radiation is not absorbed by the coating but is reflected instead. The coating material is preferably an aluminum alloy.

The circuit is preferably passivated with a passivating material, such as silicon nitride having the general formula $Si_xN_x$.

The source of activating radiation preferably comprises one or more light-emitting diodes (LEDs).

According to another aspect of the invention, there is provided a method of making a solid state integrated photovoltaic generator circuit. The circuit includes a source of activating radiation, an array of photovoltaic photodiodes electrically connected in series with one another and optically coupled to the source of activating radiation so as to generate an electrical signal in response to activating radiation received from the source, a switching device electrically coupled to the photodiode array and operable in response to the electrical signal, and a high impedance resistor electrically connected to the switching device. The method of the invention includes the step of fabricating at least the high impedance resistor out of substantially single-crystal silicon.

In a preferred embodiment, the switching device is a transistor, such as a FET having drain and source terminals and a channel linking the source and drain terminals. The resistor is formed in the same process step in which the channel linking the source and drain terminals of the FET is formed.

According to another aspect of the invention, there is provided a method of making a solid state photovoltaic generator circuit, which comprises the steps of:

a. providing a substantially single-crystal silicon substrate of a predetermined conductivity type;

b. forming a plurality of individual dielectrically isolated tubs in the substrate;

c. doping the tubs with a first dopant of an opposite conductivity type to that of the silicon substrate to define:

i. a plurality of photovoltaic photodiodes responsive to activating radiation; and ii. source and drain terminals of a field effect transistor (FET) characterized by a normally ON condition;

d. selectively removing a portion of the doped material of at least one of the tubs to define:

i. a substantially single-crystal silicon resistor, and ii. a channel electrically connecting the source and drain terminals of the FET;

e. doping the channel and resistor with a second dopant of the same conductivity type as the first dopant to establish a desired threshold voltage for the FET and a desired impedance for the resistor;

f. defining a gate terminal of the FET, the gate terminal being dielectrically isolated from the source and drain terminals;

g. defining electrical contact regions for the photodiodes, the terminals of the FET, and the resistor to provide electrical connections for them;

h. depositing an electrically conductive material onto the electrical contact regions;

i. subjecting the photovoltaic generator circuit to a thermal treatment to promote bonding of the electrically conductive material and the underlying silicon; and j. encapsulating and passivating the circuit.

The silicon substrate comprises a dielectrically isolated silicon substrate, preferably formed by bonding a pair of silicon wafers together with a layer of insulating silicon dioxide between them.

The method can further include the step of depositing a coating onto the resistor to prevent the activating radiation from impinging on the resistor. The coating is preferably substantially opaque to the activating radiation from the radiation source and may also be radiation-reflective so that the activating radiation is reflected from the coating and not absorbed by it. In a preferred embodiment, the coating is also electrically conductive and is the same material as the electrically conductive material deposited onto the electrical contact regions. The material is deposited over the resistor in two or more portions which are separated by an air gap which is sufficiently large to provide electrical insulation between the portions. Preferred electrically conductive coating materials include, for example, aluminum alloys.

The conductivity type of the silicon substrate and the dopants is either p-type or n-type. The dopants are selected so that their conductivity type is opposite or complementary to that of the silicon substrate.

The individual tubs are formed in the silicon substrate by establishing a network of intersecting trenches in the substrate.

These and other objects and advantages of the invention will in part be obvious and will in part appear hereinafter. The invention accordingly comprises the apparatus possessing the construction, combination of elements and arrangement of parts which are exemplified in the following detailed disclosure, the scope of which will be indicated in the claims.

BRIEF DESCRIPTION OF THE DRAWINGS

For a fuller understanding of the nature and objects of the present invention, reference should be made to the following detailed description taken in connection with the accompanying drawings, in which.

DETAILED DESCRIPTION OF THE DRAWINGS

Figure 1:
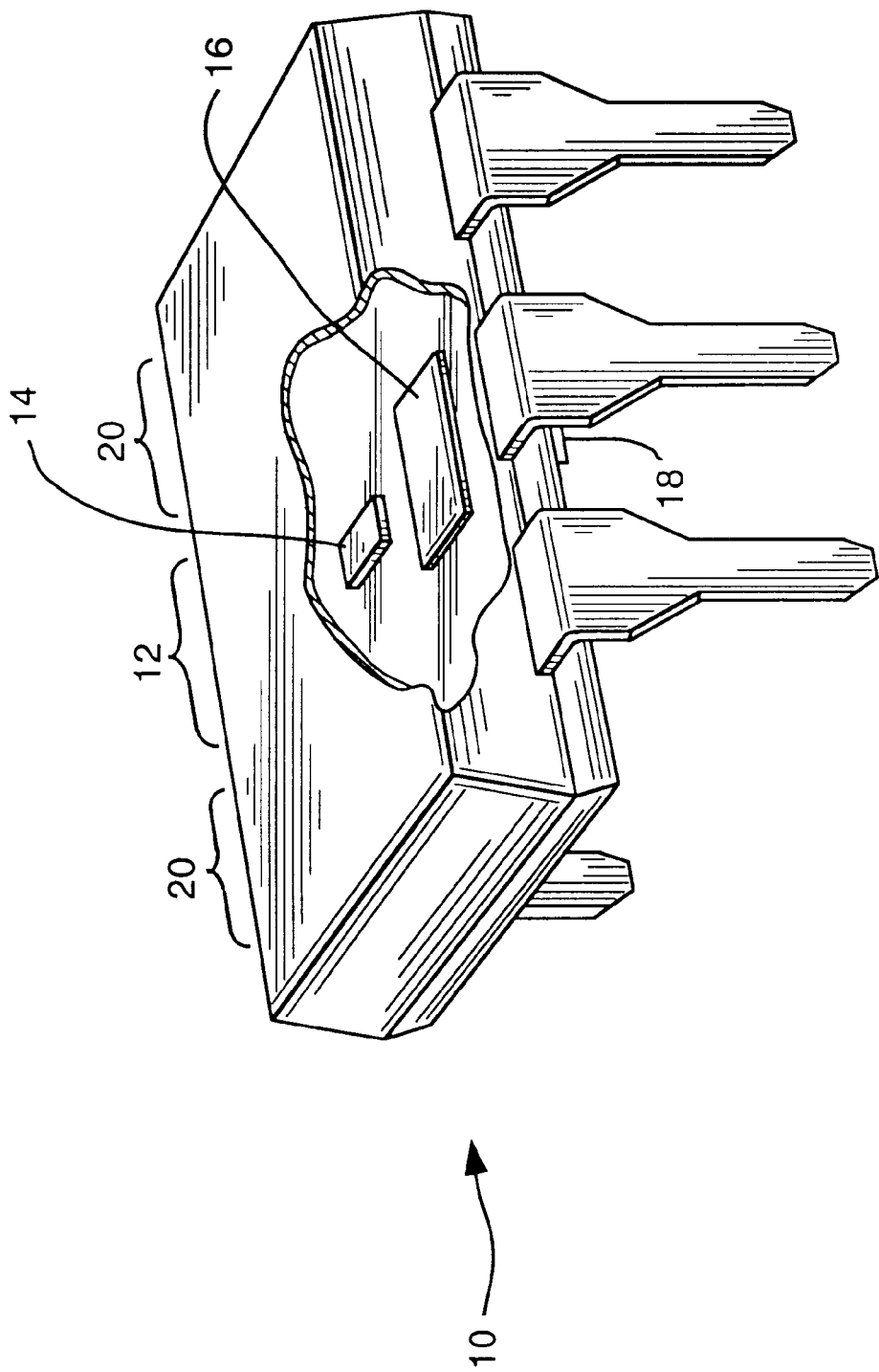
FIG. 1 is a cutaway perspective view of a photovoltaic generator circuit.
Figure 2:
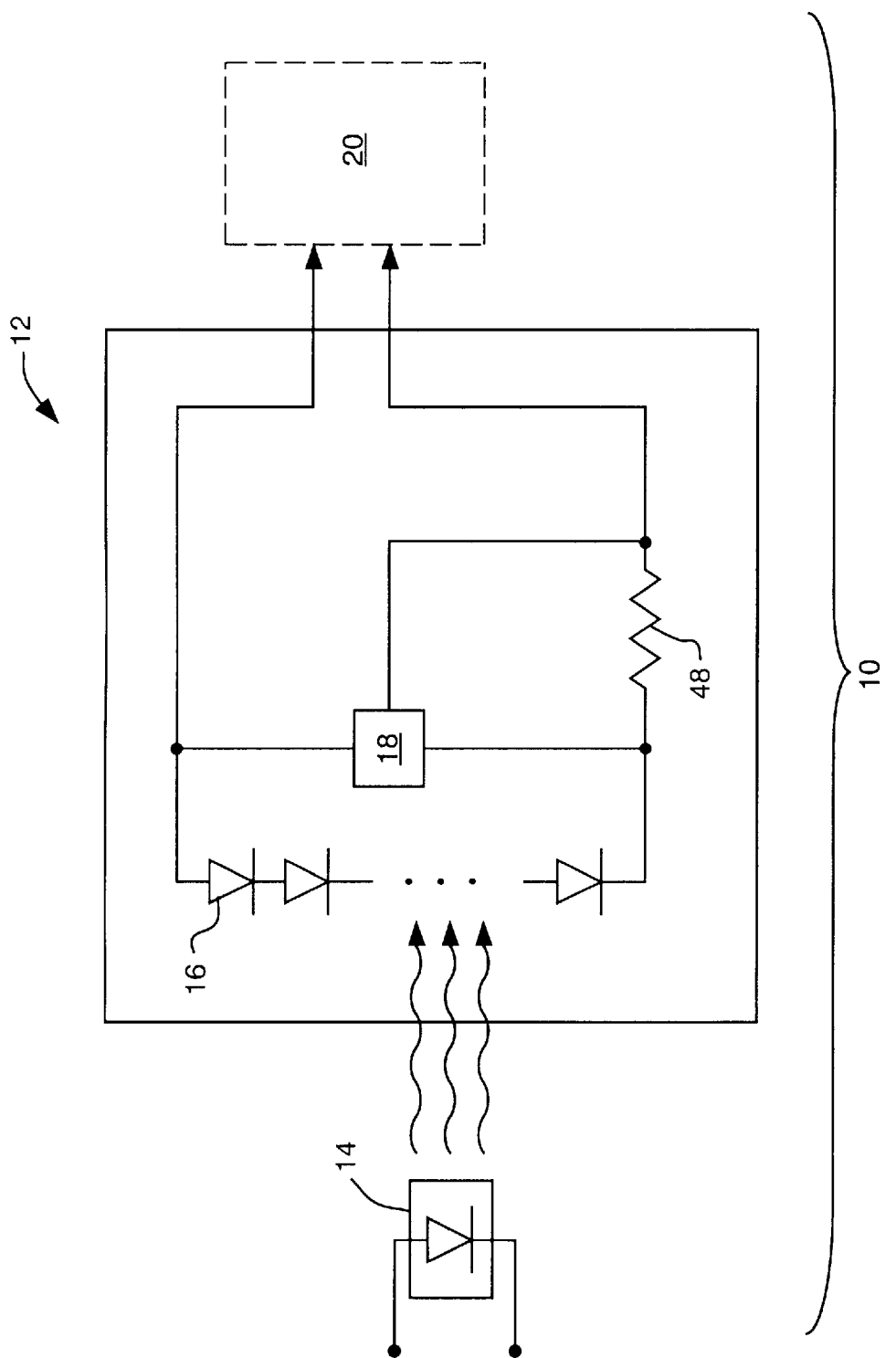
FIG. 2 is a schematic diagram of the photovoltaic generator circuit of FIG. 1.

A solid state relay 10 employing a photovoltaic generator circuit 12 is shown in FIG. 1. The relay 10 includes one or more light-emitting diodes (LEDs) 14 which generate radiation in response to electric current passed through them. The radiation impinges on an array of photodiodes 16 which generate electrical signals in response to the radiation. The signals from the photodiodes control the operation of a switching device 18 within the circuit, such as, for example, a transistor, which controls the output of the relay to provide a signal to drive an external load, illustrated generally at 20. A schematic diagram of the relay 10 is illustrated in FIG. 2.

The invention involves the fabrication of a solid state photovoltaic generator circuit in which fewer mask and process steps are required than in the fabrication of prior art photovoltaic generator circuits.

Figure 3:
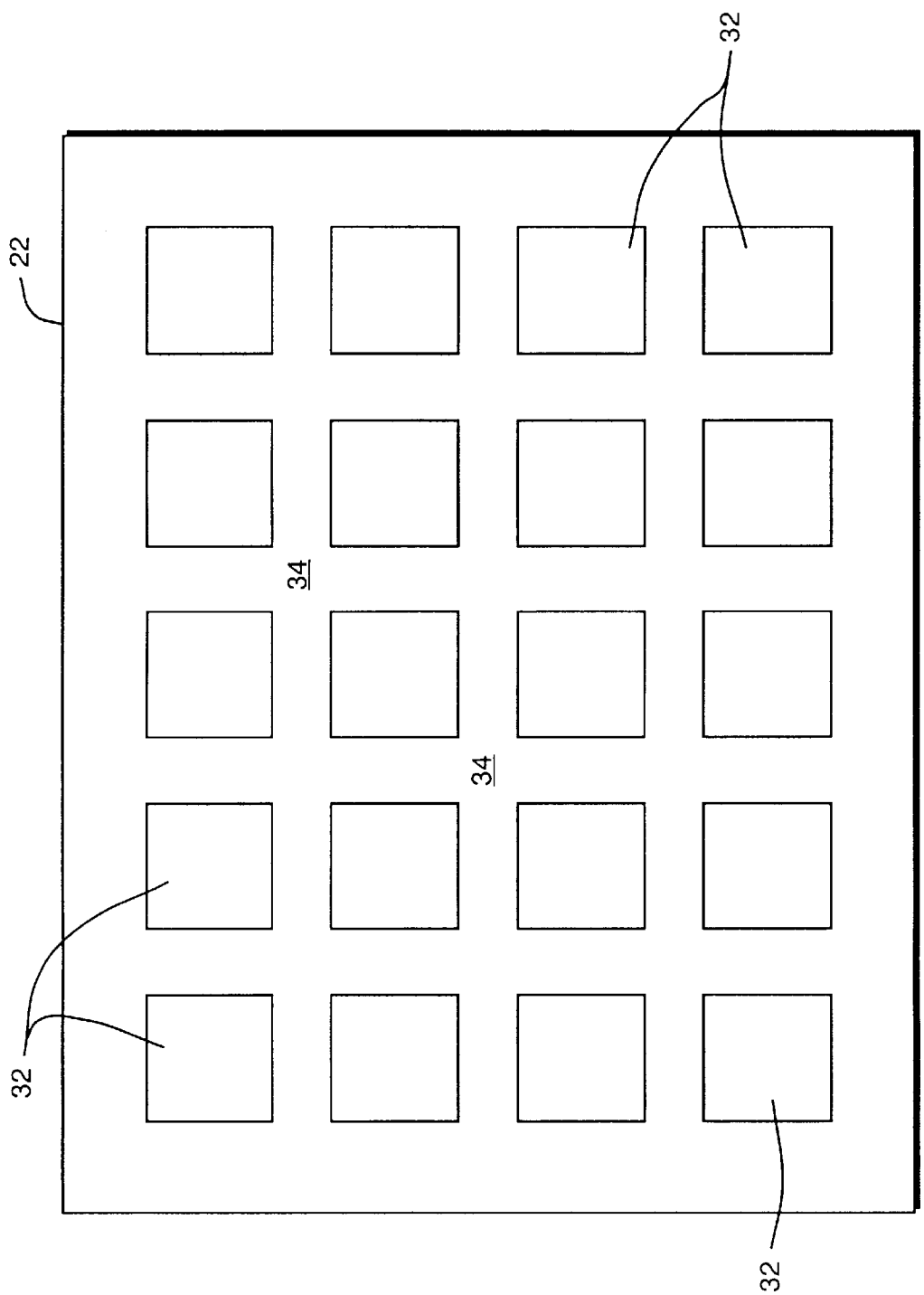
FIG. 3 is a simplified plan view of a silicon substrate in which an array of dielectrically isolated tubs is formed.

FIG. 3 illustrates in simplified form a typical fabrication layout of a solid state integrated photovoltaic generator circuit according to the invention. A dielectrically isolated substantially single-crystal silicon substrate 22 of either conductivity type (n- or p-type) is provided. The substrate is formed according to methods known in the art and preferably comprises a bonded pair of silicon wafers.

Figure 4:
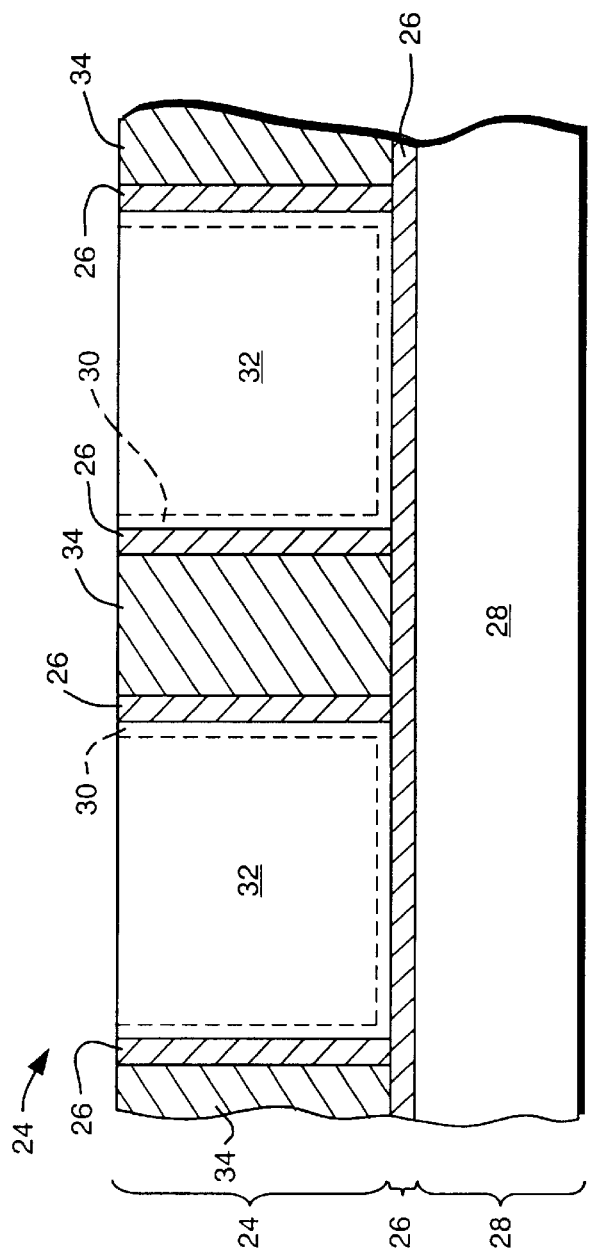
FIG. 4 is a cross-sectional detail view of the structure of a dielectrically isolated tub.

FIG. 4 illustrates the structure of a bonded wafer pair. A first silicon wafer 24 is oxidized to form a silicon dioxide layer 26 on it. A second silicon wafer 28 is bonded to the first wafer by sandwiching the silicon dioxide layer between them. The bonded wafer pair is then dry etched and doped on one side with a complementary or opposite conductivity-type dopant 30 according to known methods to obtain a plurality of dielectrically isolated tubs 32 separated by a network of intersecting trenches 34, as shown in FIGS. 3 and 4. The trenches may be filled with undoped poly-crystal silicon.

Figure 5:
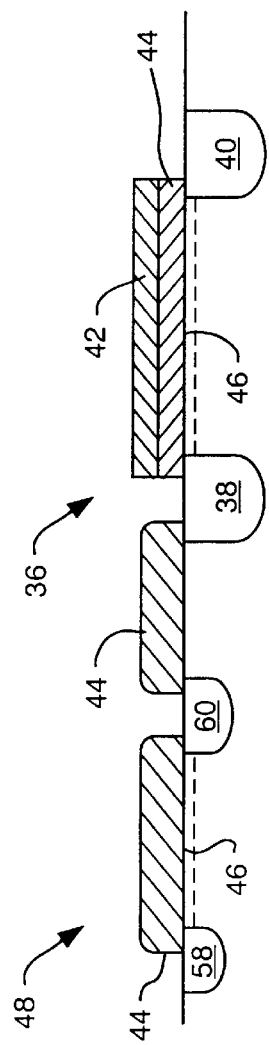
FIG. 5 is a cross-sectional detail view of the structure of a FET.

FIG. 5 illustrates in simplified form the structure of a field-effect transistor 36, and resistor 48. The FET 36 includes a source terminal 38, a drain terminal 40, and a gate terminal 42. The resistor 48 includes nodes 58, 60. The source and drain terminals 38, 40 of the FET 36 and nodes 58, 60 of the resistor 48 are formed as pockets of one conductivity type (n or p) within a region of silicon of an opposite conductivity type. An electrically insulating layer 44 is deposited over the source and drain terminals 38, 40 of the FET 36 and over the nodes 58, 60 of the resistor 48 to isolate them electrically from each other, in the case of of the FET, to isolate the source and drain terminals 38, 40 and from the gate terminal 42. A channel 46 electrically linking the source and drain terminals 38, 40 of the FET 36 and the nodes 58, 60 of the resistor 48 is formed by lightly doping or implanting the silicon substrate with a dopant of the opposite conductivity type. The extent of channel doping determines the pinchoff, or shutoff, voltage $V_p$ of the FET and the conductivity of the resistor 48.

The fabrication step in which the channel is defined is also the step in which the high-impedance resistor 48 is formed. The single-crystal silicon substrate is lightly doped with a sufficient amount of a dopant of an opposite conductivity type to establish an impedance of at least 1 megohm, and preferably in the range of 1 to 20 megohms. Thus, the resistor 48 and channel 46 of the FET are formed in a single process step.

Figure 6:
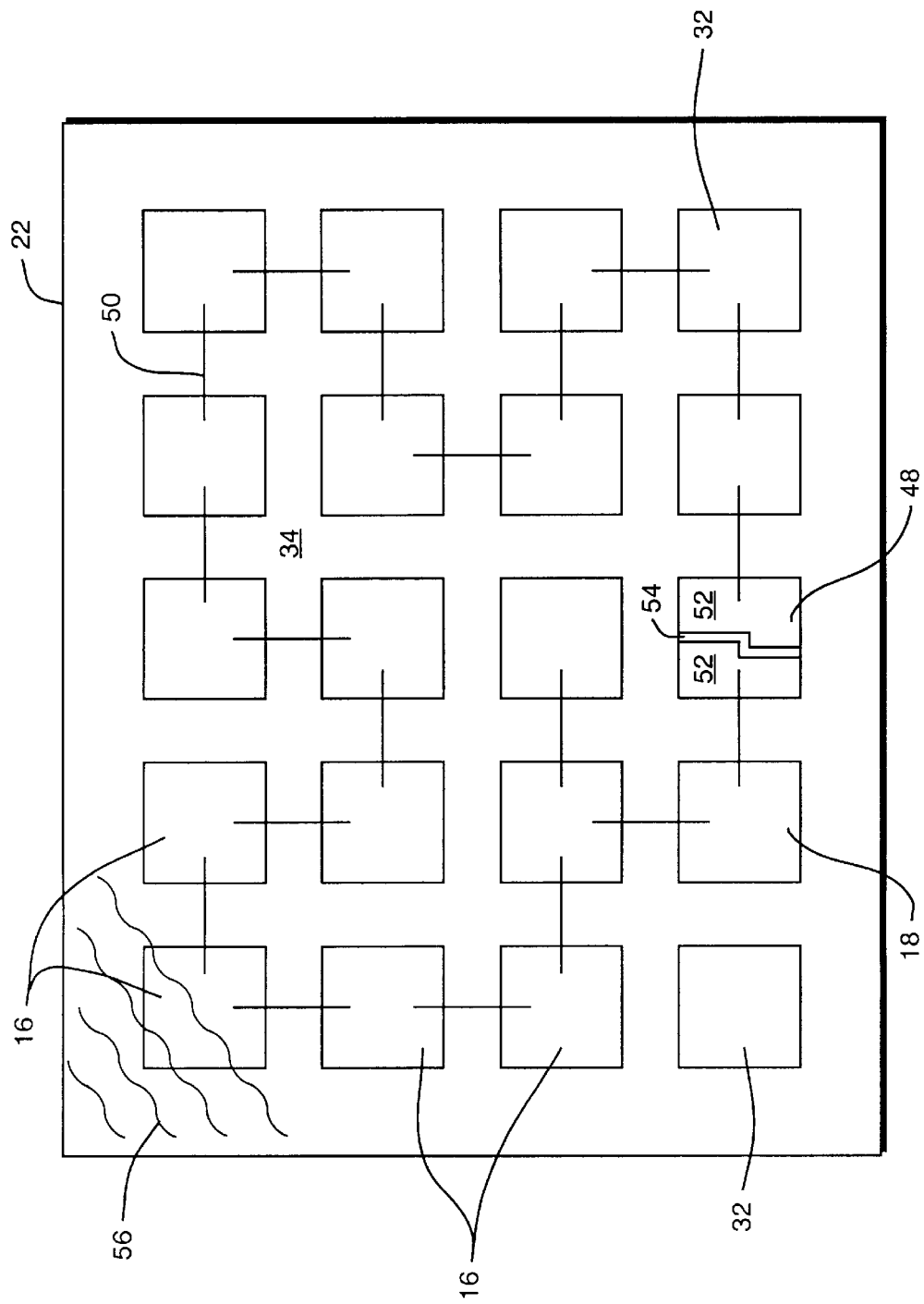
FIG. 6 is a simplified plan view of the circuit of FIGS. 1 and 2.

The photovoltaic generator circuit is shown in simplified form in FIG. 6. An array or string of photovoltaic photodiodes 16 are electrically connected in series with one another via electrical contact regions 50. The number of photodiodes 16 is not critical, provided a sufficient number is used to ensure that the signal obtained from the photodiodes is of sufficient magnitude to drive the switching device 18, which is preferably a field effect transistor (FET) characterized by a normally ON condition. The array of photodiodes is connected in parallel with the switching device 18, and a high-impedance resistor 48 is connected across the source and gate terminals of the FET.

The photovoltaic generator circuit 12 of FIG. 6, including a photodiode array 16, a switching device 18 and a high-impedance resistor 48, can be made according to the following process steps. First, a substantially single-crystal silicon substrate 22 of either a p-type or an n-type silicon is provided. The silicon substrate is dry etched to define a plurality of dielectrically isolated tubs 32 separated from one another by trenches 34. A predetermined number of those tubs are lightly doped with a dopant of an opposite conductivity type in a sufficient amount to define a plurality of photodiodes 16 which are responsive to activating radiation from one or more radiation sources, such as, for example, LEDs. The switching device 18 is preferably a FET of the metal-oxide semiconductor variety (MOSFET) which is normally ON. In this process step, the source and drain terminals of the FET are defined.

A portion of the doped material of at least one of the tubs which is not already identified as a photodiode or switching device is then selectively removed, using photolithographic masking and etching techniques known in the art, to define a high-impedance resistor 48, as well as a channel region 46 between and electrically connecting the source and drain terminals 38, 40 of the FET 18. The channel 46 and resistor 48 are then lightly doped with a dopant of an opposite conductivity type to that of the silicon to establish a desired threshold, or pinchoff, voltage $V_p$ for the FET and a desired impedance for the resistor, which should be in the range of approximately 1 to 20 megohms.

The gate terminal 42 of the FET 18 is defined in the next process step by forming an insulating layer 44 of silicon dioxide over the channel region 46 extending between the source and drain terminals of the FET, and then depositing an electrically conductive material over the insulating layer, as shown in FIG. 5. Electrical contact regions of the photodiodes and the terminals of the FET and the resistor are then defined with known masking and etching procedures, and an electrically conductive material is deposited on the electrical contact regions to establish the electrical connections for these components. The electrically conductive material is preferably a metal, such as, for example, an aluminum alloy.

In order to optimize the performance and reliability of the resistor, a coating 52 of a material which is substantially opaque to the activating radiation from the LEDs is deposited over substantially the entire resistor to prevent the activating radiation from impinging on the resistor. The radiation-opaque coating material can be reflective so that the radiation is reflected from the coating instead of absorbed by it. In a preferred embodiment, the radiation-opaque material is the same electrically conductive material which is used in a previous process step to establish the electrical contacts for the circuit components. This material can be deposited over the resistor in the same process step as the deposition of the electrically conductive material over the electrical contact regions, thus avoiding the need for additional mask and etch steps. The material is preferably deposited over at least a substantial portion of the resistor in two or more portions which are separated by a gap 54 of a sufficient size to ensure electrical insulation between the portions to avoid shorting of the resistor.

A passivation layer 56 is then deposited over the components to encapsulate them and prevent the introduction of contaminants into the circuit. Preferred passivating materials include, for example, silicon nitride or other nitrides which can be vapor deposited using techniques known in the art. In a preferred embodiment, a silicon nitride having a nonstoichiometric formula, indicated generally by $Si_xN_x$, provides sufficient amounts of silicon to ensure electrical conductivity to mobilize and ground surface charges on the substrate.

Figure 7:
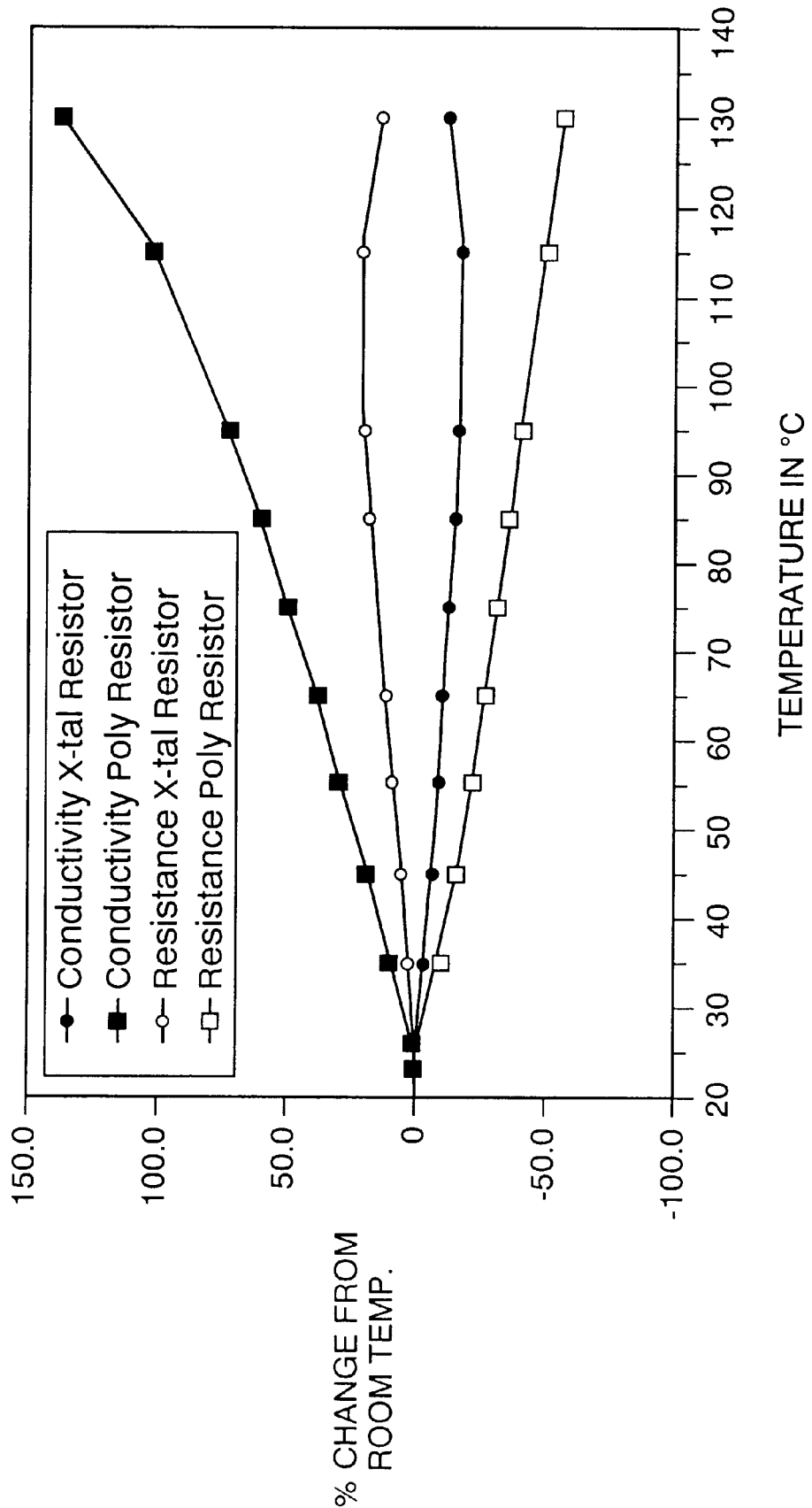
FIG. 7 is a graph comparing the thermal stability characteristics of poly-crystal and single-crystal silicon resistors over a typical operating temperature range.

FIG. 7 is a graph which indicates the superior temperature stability of the single-crystal silicon resistor relative to prior art poly-crystal silicon resistors. The conductivity and resistivity for the single-crystal silicon resistor (indicated by the closed and open circles, respectively, in the graph) are extremely stable over a temperature range extending from approximately 20° C. to 130° C. or more. In contrast, for the poly-crystal silicon resistor, the conductivity (indicated by the closed squares in the graph) rises sharply with increasing temperature to nearly 150% of its initial value over the indicated temperature range, and the resistivity (indicated by the open squares in the graph) declines linearly to 50% of its original value over the indicated temperature range. Thus, the use of single-crystal silicon resistors in photovoltaic generator circuits provides much greater temperature stability without sacrificing performance.

By using the method of this invention, the cost and labor associated with the fabrication of photovoltaic generator circuits can be reduced significantly, because the number of mask and etch steps is reduced. In addition, performance of the circuit is enhanced, because the single-crystal resistor is stable at high impedance values and over a wide operating temperature range.

Because certain changes may be made in the above apparatus without departing from the scope of the invention herein disclosed, it is intended that all matter contained in the above description or shown in the accompanying drawings shall be interpreted in an illustrative and not a limiting sense.

I claim:

1. A photovoltaic generator circuit, comprising:

a substantially single-crystal silicon substrate;

an array of photovoltaic photodiodes, coupled optically to a source of activating radiation, for generating an electrical signal in response to activating radiation received from said source;

a switching device electrically coupled to said array and operable in response to said electrical signal; and a high-impedance resistor electrically connected to said switching device;

wherein said photovoltaic photodiodes, said switching device and said resistor comprise a solid state integrated circuit, and wherein at least said high-impedance resistor is formed in the substantially single-crystal silicon substrate.

2. A photovoltaic generator circuit according to claim 1, wherein said switching device comprises a transistor.

3. A photovoltaic generator circuit according to claim 2, wherein said transistor comprises a field effect transistor (FET) characterized by a normally ON condition.

4. A photovoltaic generator circuit according to claim 3, wherein said FET includes gate, drain and source terminals, and a channel linking said source and drain terminals, wherein said resistor is formed in the same process step in which the channel is formed.

5. A photovoltaic generator circuit according to claim 4, wherein said field effect transistor is a metal oxide semiconductor field effect transistor (MOSFET).

6. A photovoltaic generator circuit according to claim 1, wherein said high-impedance resistor is formed from single-crystal silicon of a preselected conductivity type and is lightly doped with a sufficient amount of a dopant of an opposite conductivity type to impart to said resistor an impedance of at least 1 megohm.

7. A photovoltaic generator circuit according to claim 6, wherein said high-impedance resistor is characterized by an impedance in the range of approximately 1 to 20 megohms, and wherein the circuit is substantially thermally stable in an operating temperature range of at least approximately 20° to 130° C.

8. A photovoltaic generator circuit according to claim 6, flier comprising means for preventing said activating radiation from impinging on said resistor.

9. A photovoltaic generator circuit according to claim 8, wherein said means for preventing said activating radiation from impinging on said resistor comprises a coating substantially opaque to said activating radiation deposited over at least a substantial portion of said resistor.

10. A photovoltaic generator circuit according to claim 9, wherein said coating is made of a material which is substantially reflective of said activating radiation.

11. A photovoltaic generator circuit according to claim 9, wherein said coating material is electrically conductive.

12. A photovoltaic generator circuit according to claim 1 1, wherein said coating material is made of an aluminum alloy.

13. A photovoltaic generator circuit according to claim 8, further comprising a passivating material deposited over substantially the entire circuit.

14. A photovoltaic generator circuit according to claim 13, wherein the passivating material comprises silicon nitride having the general formula $Si_xN_x$.

15. A photovoltaic generator circuit according to claim 1, wherein said source of activating radiation comprises one or more light-emitting diodes (LEDs).

16. A method of making an integrated photovoltaic generator circuit on a substantially single-crystal silicon substrate, the circuit including an array of photovoltaic photodiodes electrically connected in series with one another and optically coupled to a source of activating radiation so as to generate an electrical signal in response to activating radiation received from said source, a switching device electrically coupled to said photodiode array and operable in response to said electrical signal, and a high impedance resistor electrically connected to said switching device, said method comprising the step of:

fabricating at least said high impedance resistor from the substantially single-crystal silicon substrate.

17. A method according to claim 16, wherein said switching device comprises a transistor.

18. A method according to claim 17, wherein said transistor is a field effect transistor (FET) characterized by a normally ON condition.

19. A method according to claim 17, wherein said FET includes gate, drain and source terminals, and a channel linking said source and drain terminals, wherein said resistor is formed in the same process step in which the channel is formed.

20. A method according to claim 19, wherein said field effect transistor is a metal oxide semiconductor field effect transistor (MOSFET).

21. A method according to claim 18, wherein said step of fabricating said high impedance resistor includes the steps of forming said resistor from single-crystal silicon of a preselected conductivity type and lightly doping said silicon with a sufficient amount of a dopant of an opposite conductivity type to impart to said resistor an impedance of at least 1 megohm.

22. A method according to claim 21, wherein said step of forming said high impedance resistor includes the step of doping the silicon sufficiently so that the resistor has an impedance in the range of approximately 1 to 20 megohms.

23. A method according to claim 21, wherein said step of forming said high impedance resistor includes the step of forming said resistor so that the circuit is substantially thermally stable in an operating temperature range of at least approximately 20° to 130° C.

24. A method of making a solid state photovoltaic generator circuit, said method comprising the steps of:

a. providing a substantially single-crystal silicon substrate of a predetermined conductivity type;

b. forming a plurality of individual dielectrically isolated tubs in said substrate;

c. doping said tubs with a first dopant of an opposite conductivity type to that of the silicon substrate to define:
   i. a plurality of photovoltaic photodiodes responsive to activating radiation; and
   ii. source and drain terminals of a field effect transistor (FET) characterized by a normally ON condition;

d. selectively removing a portion of the doped material of at least one of said tubs to define:
   i. a substantially single-crystal silicon resistor, and
   ii. a channel electrically connecting said source and drain terminals of said FET;

e. doping said channel and said resistor with a second dopant to establish a desired threshold voltage for said FET and a desired impedance for said resistor;

f defining a gate terminal of said FET, said gate terminal being dielectrically isolated from said source and drain terminals;

g. defining electrical contact regions for said photodiodes, said terminals of said FET, and said resistor to provide electrical connections for said photodiodes, said FET and said resistor;

h. depositing an electrically conductive material onto said electrical contact regions;

i. subjecting said photovoltaic generator circuit to a thermal treatment to promote bonding between said electrically conductive material and the underlying silicon; and j. encapsulating and passivating the circuit.

25. A method according to claim 24, wherein silicon substrate comprises a dielectrically isolated silicon substrate.

26. A method according to claim 25, further including the step of forming said dielectrically isolated silicon substrate by bonding a pair of silicon wafers together with a layer of insulating silicon dioxide between the wafers.

27. A method according to claim 24, further including the step of depositing a coating of a material substantially opaque to said activating radiation onto said resistor to substantially prevent said activating radiation from impinging on the resistor.

28. A method according to claim 27, wherein said coating material is substantially reflective of said activating radiation.

29. A method according to claim 27, wherein said coating material comprises an aluminum alloy.

30. A method according to claim 28, wherein said step of depositing said coating material includes the step of depositing said material over said resistor in two or more portions separated by a gap of sufficient dimension to provide electrical insulation between said portions.

31. A method according to claim 24, wherein said conductivity type of said silicon substrate and said dopants is selected from the group consisting of n-type and p-type, and wherein the conductivity type of said silicon substrate is opposite to the conductivity type of said dopants.

32. A method according to claim 24, wherein said step of forming said individual tubs in said silicon substrate includes the step of establishing a network of intersecting trenches defining said individual tubs therebetween.

33. A method according to claim 24, wherein said step of doping said resistor includes the step of doping said resistor with a sufficient amount of said second dopant to impart to said resistor an impedance value of at least 1 megohm.

34. A method according to claim 33, wherein said doping step includes the step of doping the resistor so that the impedance value of said resistor is in the range of approximately 1 to 20 megohms.

35. A method according to claim 24, further including the step of encapsulating and passivating said circuit with silicon nitride having the general formula $Si_xN_x$.

36. A method according to claim 24, wherein said second dopant is the same conductivity type as the first dopant.

37. A solid state integrated circuit, comprising a substantially single-crystal silicon substrate, a field-effect transistor (FET) having source, drain and gate terminals and a channel linking said source and drain terminals, and a resistor electrically connected to the FET, wherein at least the resistor is formed in the single-crystal silicon substrate.

38. A solid state integrated circuit according to claim 37, wherein the resistor and the channel of the FET are formed in the substantially single-crystal silicon substrate.

39. A solid state integrated photovoltaic generator circuit, comprising:
   a substantially single-crystal silicon substrate;
   an array of photovoltaic photodiodes coupled optically to a source of activating radiation for generating an electrical signal in response to activating radiation received from said source;
   a switching device electrically coupled to said array and operable in response to said electrical signal; and
   a high-impedance resistor electrically connected to said switching device,
   wherein said photovoltaic photodiodes, said switching device and said resistor comprise a solid state integrated circuit, and wherein at least said high-impedance resistor is formed in the substantially single-crystal silicon substrate, and wherein said circuit is fabricated according to a method comprising the steps of:

a. providing a substantially single-crystal silicon substrate of a predetermined conductivity type;
   b. forming a plurality of individual dielectrically isolated tubs in said substrate;
   c. doping said tubs with a first dopant of an opposite conductivity type to that of the silicon substrate to define:
      i. a plurality of photovoltaic photodiodes responsive to activating radiation; and
      ii. source and drain terminals of a field effect transistor (FET) characterized by a normally ON condition;
   d. selectively removing a portion of the doped material of at least one of said tubs to define:
      i. a substantially single-crystal silicon resistor, and
      ii. a channel electrically connecting said source and drain terminals of said FET;
   e. doping said channel and said resistor with a second dopant to establish a desired threshold voltage for said FET and a desired impedance for said resistor;
   f. defining a gate terminal of said FET, said gate terminal being dielectrically isolated from said source and drain terminals;
   g. defining electrical contact regions for said photodiodes, said terminals of said FET, and said resistor to provide electrical connections for said photodiodes, said FET and said resistor;
   h. depositing an electrically conductive material onto said electrical contact regions;
   i. subjecting said photovoltaic generator circuit to a thermal treatment to promote bonding between said electrically conductive material and the underlying silicon; and
   j. encapsulating and passivating the circuit.

40. A photovoltaic generator circuit according to claim 39, wherein silicon substrate comprises a dielectrically isolated silicon substrate.

41. A photovoltaic generator circuit according to claim 40, further including the step of forming said dielectrically isolated silicon substrate by bonding a pair of silicon wafers together with a layer of insulating silicon dioxide between the wafers.

42. A photovoltaic generator circuit according to claim 39, further including the step of depositing a coating of a material substantially opaque to said activating radiation onto said resistor to substantially prevent said activating radiation from impinging on the resistor.

43. A photovoltaic generator circuit according to claim 42, wherein said coating material is substantially reflective of said activating radiation.

44. A photovoltaic generator circuit according to claim 43, wherein said coating material comprises an aluminum alloy.

45. A photovoltaic generator circuit according to claim 43, wherein said step of depositing said coating material includes the step of depositing said material over said resistor in two or more portions separated by a gap of sufficient dimension to provide electrical insulation between said portions.

46. A photovoltaic generator circuit according to claim 39, wherein said conductivity type of said silicon substrate and said dopants is selected from the group consisting of n-type and p-type, and wherein the conductivity type of said silicon substrate is opposite to the conductivity type of said dopants.

47. A photovoltaic generator circuit according to claim 39, wherein said step of forming said individual tubs in said silicon substrate includes the step of establishing a network of intersecting trenches defining said individual tubs therebetween.

48. A photovoltaic generator circuit according to claim 39, wherein said step of doping said resistor includes the step of doping said resistor with a sufficient amount of said second dopant to impart to said resistor an impedance value of at least 1 megohm.

49. A photovoltaic generator circuit according to claim 48, comprising the further step of doping the resistor so that the impedance value of said resistor is in the range of approximately 1 to 20 megohms.

50. A photovoltaic generator circuit according to claim 39, further including the step of encapsulating and passivating said circuit with silicon nitride having the general formula $Si_xN_x$.

51. A photovoltaic generator circuit according to claim 39, wherein said second dopant is the same conductivity type as the first dopant.

* * * * *